US012770558B2

(12) United States Patent
Endo

(10) Patent No.: US 12,770,558 B2
(45) Date of Patent: Oct. 20, 2026

(54) LIGHT EMITTING DEVICE, PHOTOELECTRIC CONVERSION DEVICE, AND ELECTRONIC APPARATUS, WITH DRIVING CIRCUIT IN FIRST BOARD AND SIGNAL PROCESSING CIRCUIT IN SECOND BOARD AT LEAST PARTIALLY OVERLAPPING

(71) Applicant: CANON KABUSHIKI KAISHA, Tokyo (JP)

(72) Inventor: Wataru Endo, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 43 days.

(21) Appl. No.: 18/944,576

(22) Filed: Nov. 12, 2024

(65) Prior Publication Data

US 2025/0191532 A1 Jun. 12, 2025

(30) Foreign Application Priority Data

Dec. 7, 2023 (JP) ................................ 2023-207170

(51) Int. Cl.

| | |
|---|---|
| ***G09G 3/3225*** | (2016.01) |
| ***G09G 3/3275*** | (2016.01) |
| ***H04N 23/53*** | (2023.01) |
| ***H10K 59/121*** | (2023.01) |

(52) U.S. Cl.

CPC ......... *G09G 3/3225* (2013.01); *G09G 3/3275* (2013.01); *H04N 23/53* (2023.01); *G09G 2310/0291* (2013.01); *H10K 59/1213* (2023.02)

(58) Field of Classification Search

CPC ............... G09G 3/3225; G09G 3/3275; G09G 2310/0291; H04N 23/53; H10K 59/1213

See application file for complete search history.

(56) References Cited

U.S. PATENT DOCUMENTS

| | | | | |
|---|---|---|---|---|
| 10,319,743 | B2 | 6/2019 | Kurokawa | |
| 10,818,241 | B2 | 10/2020 | Kim | |
| 11,417,722 | B2 | 8/2022 | Gunji | |
| 2018/0175074 | A1 | 6/2018 | Kurokawa | |
| 2019/0206330 | A1 | 7/2019 | Kim | |
| 2020/0365681 | A1 | 11/2020 | Gunji | |
| 2022/0350432 | A1* | 11/2022 | Takahashi | G09F 9/30 |
| 2022/0415262 | A1* | 12/2022 | Kim | G09G 3/20 |

(Continued)

FOREIGN PATENT DOCUMENTS

| | | | |
|---|---|---|---|
| JP | 2018-101783 | A | 6/2018 |
| JP | 2019-120944 | A | 7/2019 |

(Continued)

*Primary Examiner* — Gevell V Selby
(74) *Attorney, Agent, or Firm* — Venable LLP

(57) ABSTRACT

A light emitting device is provided. The device includes a first board in which a data signal line and a plurality of pixels connected to the data signal line are arranged, and a second board in which a signal processing circuit including a digital-analog conversion circuit is arranged to supply a data signal based on input image data to the plurality of pixels. The first board further includes a driving circuit configured to supply, to the data signal line, a signal voltage based on the data signal input from the signal processing circuit, and in a planar view, the driving circuit in the first board and the signal processing circuit in the second board are arranged to at least partially overlap each other.

13 Claims, 12 Drawing Sheets

(56) References Cited

U.S. PATENT DOCUMENTS

| | | | | |
|---|---|---|---|---|
| 2023/0005400 | A1 | 1/2023 | Endo et al. | |
| 2023/0090509 | A1 | 3/2023 | Kato | |
| 2023/0157126 | A1* | 5/2023 | Jinta | H04N 25/70 257/40 |
| 2023/0180578 | A1* | 6/2023 | Jinta | G09G 3/3233 257/89 |

FOREIGN PATENT DOCUMENTS

| | | | |
|---|---|---|---|
| JP | 2019-138938 | A | 8/2019 |
| JP | 2023-044407 | A | 3/2023 |

* cited by examiner

LIGHT EMITTING DEVICE, PHOTOELECTRIC CONVERSION DEVICE, AND ELECTRONIC APPARATUS, WITH DRIVING CIRCUIT IN FIRST BOARD AND SIGNAL PROCESSING CIRCUIT IN SECOND BOARD AT LEAST PARTIALLY OVERLAPPING

BACKGROUND OF THE INVENTION

Field of the Invention

The present invention relates to a light emitting device, a photoelectric conversion device, and an electronic apparatus.

Description of the Related Art

Japanese Patent Laid-Open No. 2019-138938 describes a display device including a light emitting element using an organic electroluminescence (EL) element. In the display device described in Japanese Patent Laid-Open No. 2019-138938, when a video signal corresponding to image data is given to each pixel arranged in a display region from a driver IC via a signal line, an image corresponding to the image data is displayed.

The load on the display region driven by the driver IC changes depending on the number and size of pixels arranged in the display region. Accordingly, the driving capability required for the driver IC changes in accordance with the display region. On the other hand, a general-purpose driver IC often includes a driving circuit with a high driving capability to support driving of display regions of various specifications. However, when using the driver IC including the driving circuit with the high driving capability, depending on the specification of the display region, the driving circuit has an excessive driving capability and the size and power consumption of the driver IC may become excessive.

SUMMARY OF THE INVENTION

Some embodiments of the present invention provide a technique advantageous in driving according to the specifications of a display region.

According to some embodiments, a light emitting device comprising: a first board in which a data signal line and a plurality of pixels connected to the data signal line are arranged; and a second board in which a signal processing circuit including a digital-analog conversion circuit is arranged to supply a data signal based on input image data to the plurality of pixels, wherein the first board further includes a driving circuit configured to supply, to the data signal line, a signal voltage based on the data signal input from the signal processing circuit, and in a planar view, the driving circuit in the first board and the signal processing circuit in the second board are arranged to at least partially overlap each other, is provided.

Further features of the present invention will become apparent from the following description of exemplary embodiments (with reference to the attached drawings).

DESCRIPTION OF THE EMBODIMENTS

Figure 1:
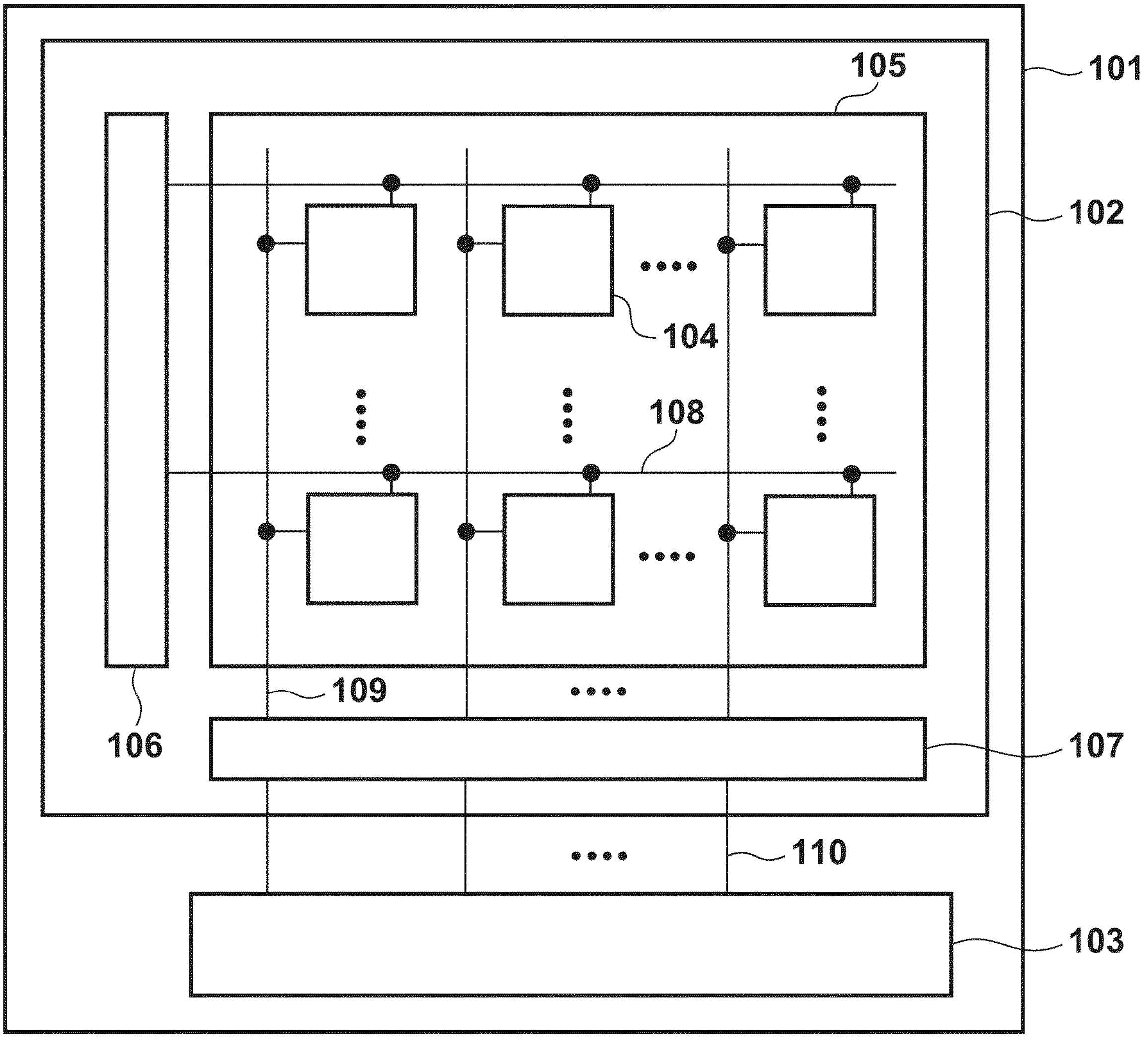
FIG. 1 is a circuit diagram showing an example of the arrangement of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1 to 7, a light emitting device according to an embodiment of the present disclosure will be described. The following embodiments are merely examples of the present disclosure and not intended to limit the scope of the invention according to the appended claims. FIG. 1 is a circuit diagram showing an example of the arrangement of a light emitting device 101 according to the present disclosure. As shown in FIG. 1, the light emitting device 101 can include a display board 102 and a display data control board 103. Each of the display board 102 and the display data control board 103 can be formed on, for example, one semiconductor substrate or an insulating substrate of glass, plastic, or the like. Depending on their sizes, the display board 102 and the display data control board 103 can also be called a display chip and a display data control chip, respectively.

In the display board 102, a pixel array 105 including a plurality of pixels 104 two-dimensionally arranged in a matrix is arranged. Each pixel 104 arranged in the display board 102 (pixel array 105) includes a light emitting element. Further, a vertical scanning circuit 106 and a driving circuit 107 are arranged in the display board 102. In the pixel array 105, a plurality of scanning lines 108 are arranged along the row direction (the horizontal direction in FIG. 1), each of which is connected to the pixels 104 arranged for each row among the pixels 104 arranged in the pixel array 105. In the pixel array 105, a plurality of data signal lines 109 are arranged along the column direction (the vertical direction in FIG. 1), each of which is connected to the pixels 104 arranged for each column among the pixels 104 arranged in the pixel array 105.

Each scanning line 108 is connected to the output terminal in the corresponding row in the vertical scanning circuit 106. When writing a luminance signal in each pixel 104 arranged in the pixel array 105, the vertical scanning circuit 106 supplies a write control signal to the scanning line 108. Each data signal line 109 is connected to the output terminal in the corresponding column in the driving circuit 107. Signal lines 110, to each of which a data signal is supplied from the display data control board 103 to the driving circuit 107, are connected to the input terminals of the driving circuit 107.

The display data control board 103 is arranged to supply, to the plurality of pixels 104, data signals based on image data input from the outside of the light emitting device 101. The arrangement of the display data control board 103 will be described later.

The display data control board 103 outputs, to the signal line 110, a data signal having a voltage corresponding to the luminance information of the light emitting element arranged in each pixel 104. The driving circuit 107 arranged in the display board 102 supplies, to the data signal line 109, a luminance signal having a signal voltage corresponding to the data signal input from the display data control board 103.

Figure 2:
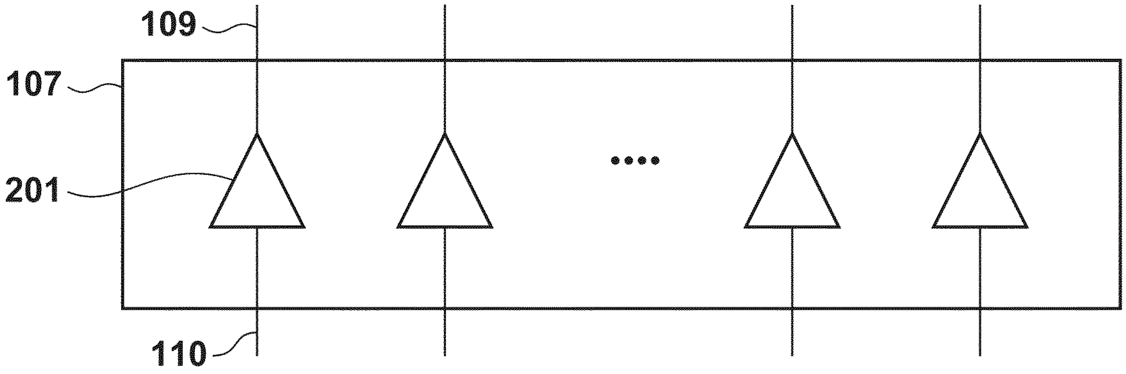
FIG. 2 is a circuit diagram showing an example of the arrangement of the driving circuit of the light emitting device shown in FIG. 1.

FIG. 2 is a circuit diagram showing an example of the arrangement of the driving circuit 107. As shown in FIG. 2, the driving circuit 107 can include, for example, a plurality of buffers 201. The signal line 110 is connected to the input terminal of each buffer 201, and the data signal supplied from the display data control board 103 is input to the input terminal. The buffer 201 outputs, to the data signal line 109, the luminance signal having the signal voltage based on the data signal.

Here, the driving circuit 107 is not limited to the arrangement shown in FIG. 2. For example, the driving circuit 107 may include a demultiplexer in addition to the buffers 201, and the demultiplexer may be capable of receiving the luminance signals output from the buffers 201 and outputting them while switching the plurality of data signal lines 109. The number of the signal lines 110 connected to the driving circuit 107 may be the same as or different from the number of the data signal lines 109 connected to the driving circuit 107. It is sufficient that the numbers of the signal lines 110 and the data signal lines 109 have an appropriate relationship according to the arrangement of the driving circuit 107.

To make the pixel 104 emit light with a predetermined luminance, the driving circuit 107 needs to drive the data signal line 109 such that the voltage of the data signal line 109 is settled at the voltage of a predetermined luminance signal within a predetermined period. Further, since the data signal line 109 is connected to multiple pixels 104 as shown in FIG. 1, the load capacitance of the data signal line 109 can change in accordance with the specification such as the number and size of the pixels 104 included in the pixel array 105 arranged in the display board 102. Therefore, in accordance with the load capacitance of the data signal line 109, the driving circuit 107 is required to have an appropriate driving capability to cause the voltage of the data signal line 109 to be settled at the voltage of a predetermined luminance signal within a predetermined period.

In this embodiment, the driving circuit 107 is arranged in the display board 102. Therefore, it is possible to decide the driving capability of the driving circuit 107 to the appropriate driving capability in accordance with the load capacitance of the data signal line 109 which is decided based on the specifications such as the number and size of the pixels 104 included in the pixel array 105 arranged in the display board 102. That is, the size and power consumption of the driving circuit 107 can be designed to have appropriate values. Accordingly, the size of the light emitting device 101 is not increased more than necessary depending on the size of the driving circuit 107.

Figure 3:
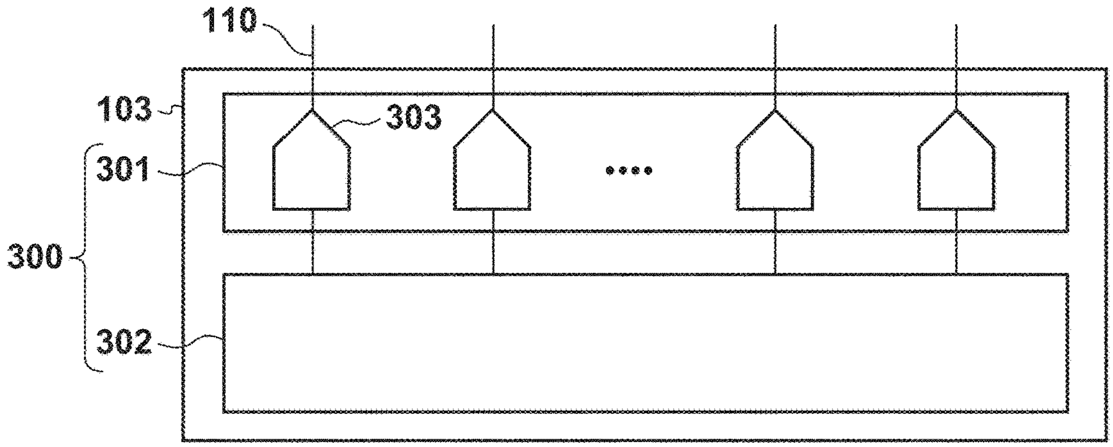
FIG. 3 is a circuit diagram showing an example of the arrangement of the signal processing circuit of the light emitting device shown in FIG. 1.

FIG. 3 is a circuit diagram showing an example of the arrangement of the display data control board 103 of the light emitting device 101 according to this embodiment. As shown in FIG. 3, a signal processing circuit 300 including a digital-analog conversion circuit (DA conversion circuit) 301 is arranged in the display data control board 103 to supply the data signals based on the input image data to the plurality of pixels 104. More specifically, the display data control board 103 can include the DA conversion circuit 301 and a display data control circuit 302.

The display data control circuit 302 outputs a tone signal based on the luminance information of the light emitting element of each pixel 104 arranged in the pixel array 105, which is supplied as the image data, to the DA conversion circuit 301. The DA conversion circuit 301 can be formed from a plurality of Digital-Analog Converters (DACs) 303. The DAC 303 outputs the data signal to the signal line 110 in accordance with the tone signal output from the display data control circuit 302.

Here, the DA conversion circuit 301 is not limited to the arrangement shown in FIG. 3. For example, the DA conversion circuit 301 may include a tone voltage generation circuit in addition to the plurality of DACs 303, and the DAC 303 may output the data signal based on a tone voltage generated by the tone voltage generation circuit.

Figure 4:
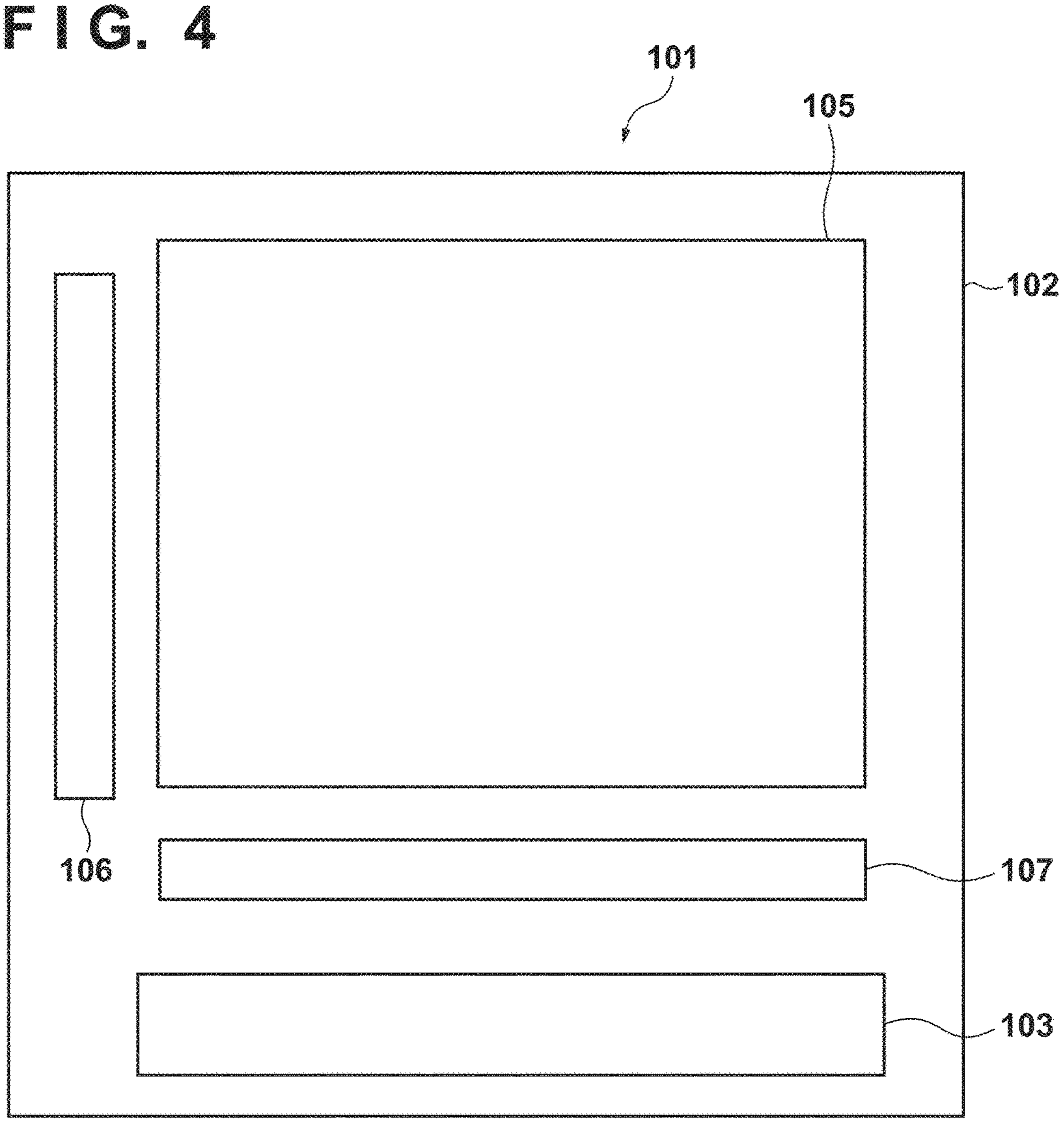
FIG. 4 is a block diagram showing an example of the arrangement of the light emitting device shown in FIG. 1.

FIG. 4 is a block diagram showing a plan view of an example of the arrangement of the light emitting device 101 in this embodiment. The display data control board 103 is arranged on the display board 102. The display board 102 and the display data control board 103 may be interconnected by, for example, chip-on-chip mounting. That is, a plurality of input terminals of the display board 102 are electrically connected to a plurality of output terminals of the display data control board 103, respectively. The driving circuit 107 is arranged between the pixel array 105 and the display data control board 103. As has been described above, the driving circuit 107 receives the data signal output from the display data control board 103, and outputs the luminance signal having the signal voltage based on the data signal to the data signal line 109.

In this embodiment, the driving circuit 107 is arranged in the display board 102. The driving capability of the driving circuit 107 can be decided in accordance with the load capacitance of the data signal line 109 which is decided based on the specifications such as the number and size of the pixels 104 arranged in the pixel array 105 in the display board 102. Accordingly, there is no need to increase the circuit area required for the driving circuit 107 to increase the driving capability of the driving circuit 107 more than necessary. Hence, an increase in size of the display board 102 can be suppressed, and the manufacturing cost can be kept low. In addition, the driving circuit 107 does not require high-speed digital signal processing, and requires the operating voltage equal to that of the pixel 104 to drive the pixel 104. Accordingly, for example, the film thickness of the gate insulating film may be the same among a transistor included in each pixel 104 arranged in the pixel array 105, a transistor included in the vertical scanning circuit 106, and a transistor included in the driving circuit 107. In other words, the transistor included in the pixel 104 arranged in the pixel array 105, the transistor included in the vertical scanning circuit 106, and the transistor included in the driving circuit 107, which are formed in the display board 102, may be formed using the same process rule. From this viewpoint, the manufacturing cost can also be kept low. On the other hand, the signal processing circuit 300 arranged in the display data control board 103 may include a transistor that is more miniaturized than the transistor arranged in each pixel 104 in the pixel array 105, the transistor arranged in the vertical scanning circuit 106, and the transistor arranged in the driving circuit 107. As has been described above, the display data control board 103 can be arranged on the display board 102 by chip-on-chip mounting. Hence, it can be easy to employ different process rules for the manufacture of the pixel array 105, vertical scanning circuit 106, and driving circuit 107 arranged in the display board 102, and for the manufacture of the signal processing circuit 300 arranged in the display data control board 103.

The load capacitance of the signal line 110 connected to the display data control board 103 does not largely change depending on the specifications such as the number and size of the pixels 104 arranged in the pixel array 105 included in the display board 102. Therefore, the common display data control board 103 can be used for the display boards 102 having various specifications. As a result, the design cost and manufacturing cost of the display data control board 103 can be kept low.

Next, with reference to FIG. 5, a modification of the light emitting device 101 shown in FIG. 4 will be described. In the arrangement shown in FIG. 5, the display data control board 103 is arranged to overlap the driving circuit 107. For example, in a planar view, the driving circuit 107 in the display board 102 and the signal processing circuit 300 in the display data control board 103 are arranged to at least partially overlap each other. Here, the planar view can indicate an orthogonal projection to the surface of the display board 102 where the pixel array 105, the vertical scanning circuit 106, and the driving circuit 107 are arranged in the light emitting device 101. The remaining arrangement may be similar to the above-described arrangement, and differences therefrom will be mainly described below.

Figure 5:
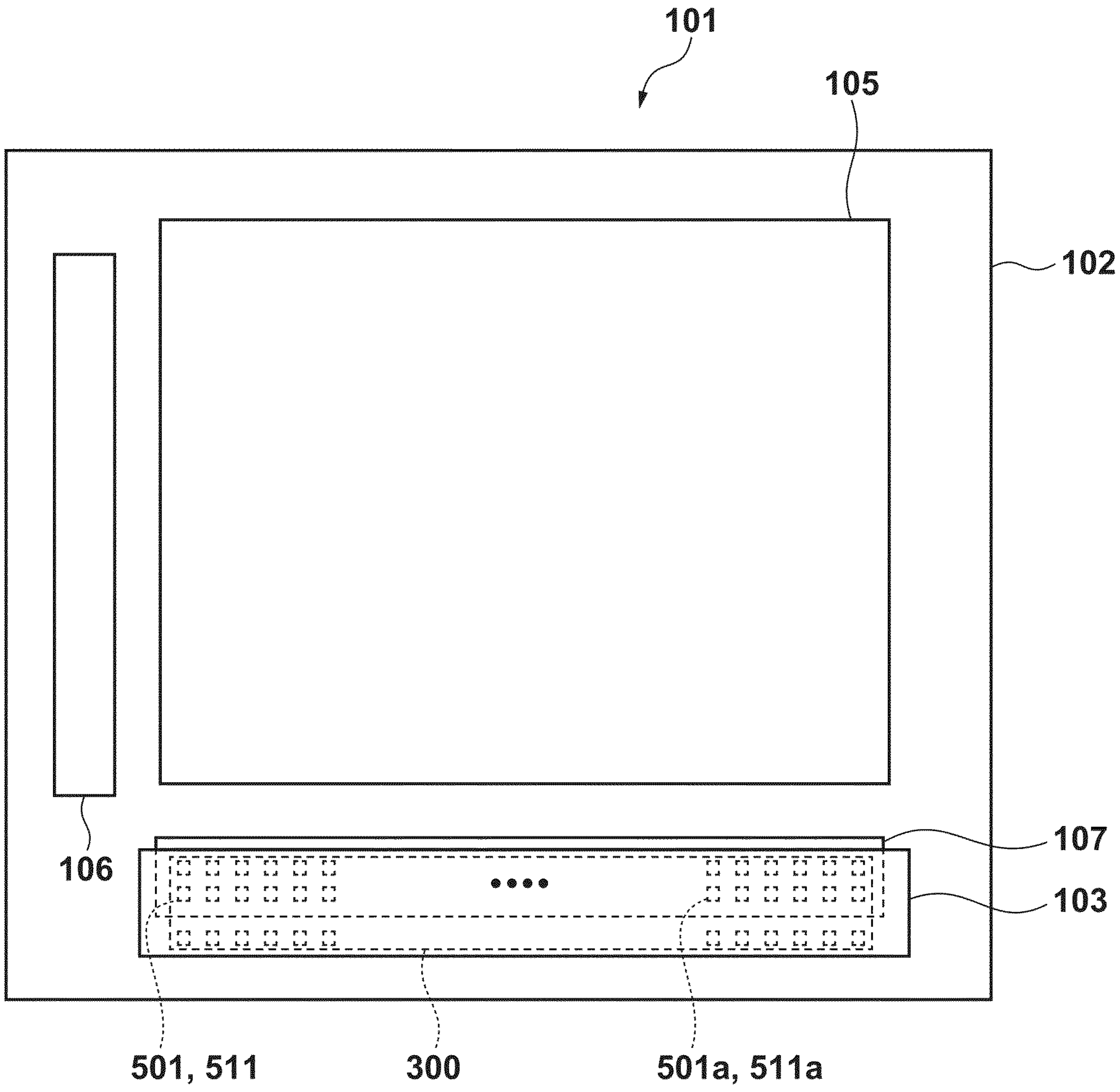
FIG. 5 is a block diagram showing an example of the arrangement of the light emitting device shown in FIG. 1.

In the arrangement shown in FIG. 5, the display data control board 103 is arranged on the display board 102 to partially overlap the driving circuit 107. The display data control board 103 is electrically connected to the display board 102 via a plurality of electrodes 501 including output terminals used to output data signals by, for example, chip-on-chip mounting. In other words, one or more of the plurality of electrodes 501 are the output terminals used to output data signals and connected, via the signal lines 110 in the display board 102, to the input terminals used to receive the data signals. A description will be given below assuming that in the arrangement shown in FIG. 5, an electrode 501*a* among the electrodes 501 arranged in the display data control board 103 is the output terminal used to output the data signal. In the display board 102, a plurality of electrodes 511 are arranged at positions overlapping the plurality of electrodes 501 arranged in the display data control board 103, and the electrode 501 and the electrode 511 can be connected to each other. Here, an electrode 511*a*, which is the input terminal used to receive the data signal among the plurality of electrodes 511 arranged in the display board 102, is arranged to overlap the electrode 501*a*.

In the arrangement shown in FIG. 5, the driving circuit 107 is arranged in the region below the display data control board 103, which is a dead space in the arrangement shown in FIG. 4. Accordingly, the board area of the display board 102 can further be reduced. In addition, as compared to the arrangement shown in FIG. 4, the display data control board 103 and the driving circuit 107 are arranged closer to each other, so that the load capacitance of the signal line 110 can be reduced. Hence, it can be said that the arrangement shown in FIG. 5 is more advantageous than the arrangement shown in FIG. 4 in that the light emitting device 101 can be driven even if the output driving capability of the display data control board 103 is low.

As shown in FIG. 5, the electrode 501*a* functioning as the output terminal arranged in the display data control board 103 and used to output the data signal may be arranged to overlap the driving circuit 107 in the planar view. According to this arrangement, the load capacitance of the signal line 110 connecting the electrode 501*a* and the driving circuit 107 can further be reduced. Hence, as in the above description, it can be said that the arrangement shown in FIG. 5 is the arrangement advantageous in terms of the driving capability of the display data control board 103. In this case, the electrode 511*a* arranged in the display board 102 and functioning as the input terminal used to receive the data signal may be arranged to overlap the driving circuit 107. With this arrangement, the load capacitance of the signal line 110 connecting the output terminal (electrode 501*a*) of the signal processing circuit 300 and the input terminal (electrode 511*a*) of the driving circuit 107 can further be reduced.

In the arrangement shown in FIG. 5, some of the electrodes 501 arranged in the display data control board 103 overlap a part of the driving circuit 107. However, the present invention is not limited to this. For example, the plurality of electrodes 501 may be arranged not to overlap the driving circuit 107. FIG. 5 shows the arrangement in which the display data control board 103 does not overlap a part of the driving circuit 107. However, the present invention is not limited to this. For example, the display data control board 103 may be arranged to cover the entire driving circuit 107.

Next, with reference to FIGS. 6 and 7, further modifications of the light emitting device 101 will be described. In the arrangements shown in FIGS. 6 and 7, the display data control board 103 is arranged on a flexible board 601. The remaining arrangement may be similar to that in each embodiment described above, and the arrangement different from each embodiment described above will be mainly described below.

Figure 6:
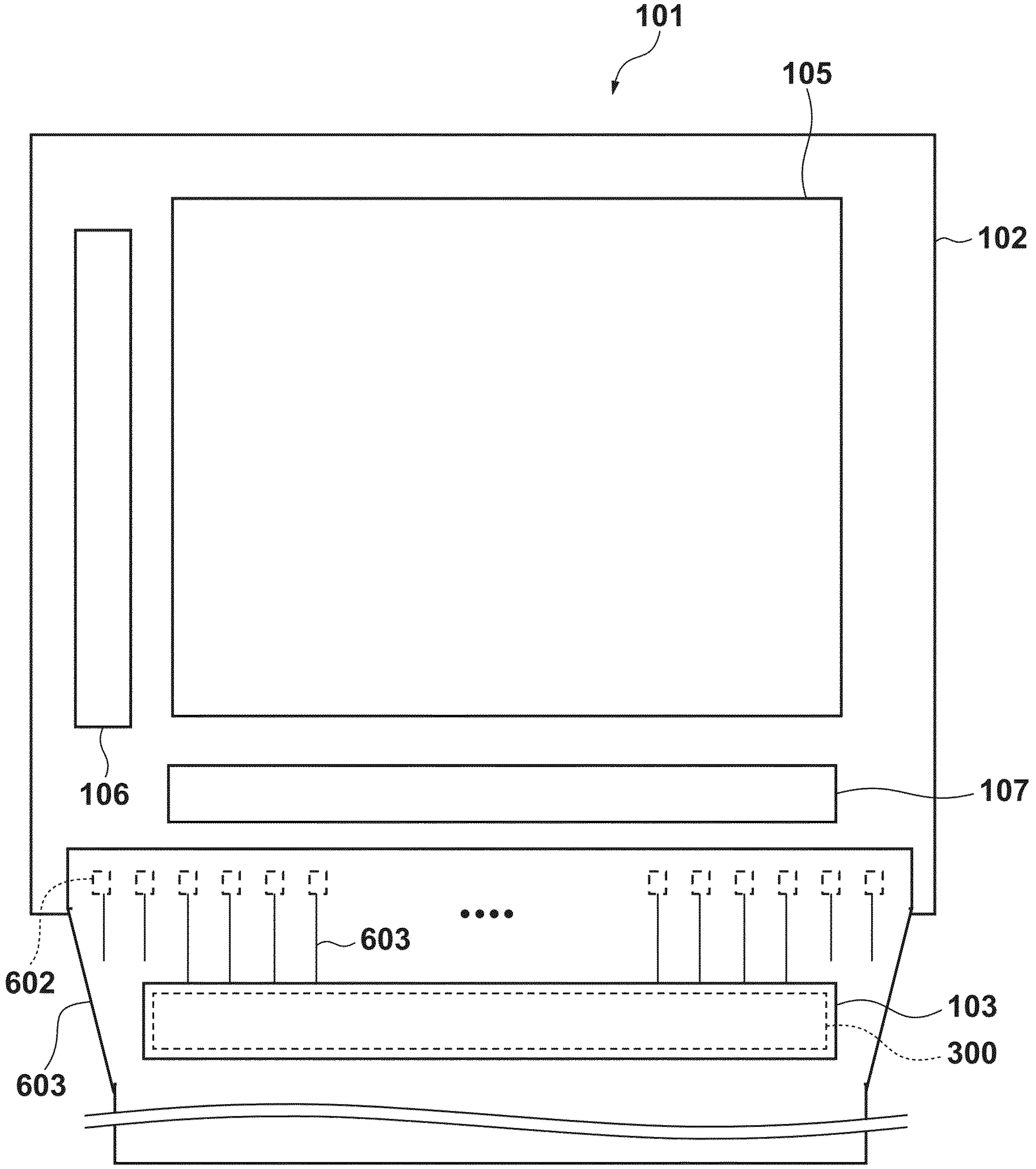
FIG. 6 is a block diagram showing an example of the arrangement of the light emitting device shown in FIG. 1.

FIG. 6 is a block diagram showing an example of the arrangement of the light emitting device 101 according to this embodiment. The display data control board 103 is arranged on the flexible board 601 by, for example, chip-on-film mounting. The flexible board 601 is electrically connected to the display board 102 via a plurality of electrodes 602. The electrode 602 is connected to a wiring pattern 603 on the flexible board 601. The signal processing circuit 300 arranged in the display data control board 103 outputs the data signal to the driving circuit 107 via the electrode 602 functioning as the output terminal used to output the data signal among the plurality of electrodes 602, and the wiring pattern 603 connected to the electrode 602 functioning as the output terminal.

In the arrangement shown in FIG. 6, for clear illustration of the display data control board 103 arranged on the flexible board 601, the flexible board 601 is shown to extend downward from the display board 102 in the drawing. However, the present invention is not limited to this. For example, by utilizing the flexibility of the flexible board 601, the driving circuit 107 in the display board 102 and the signal processing circuit 300 in the display data control board 103 may be arranged to at least partially overlap each other in the planar view. Alternatively, for example, the display data control board 103 may be arranged to cover at least a part of the driving circuit 107. With this, the light emitting device 101 can be downsized.

Figure 7:
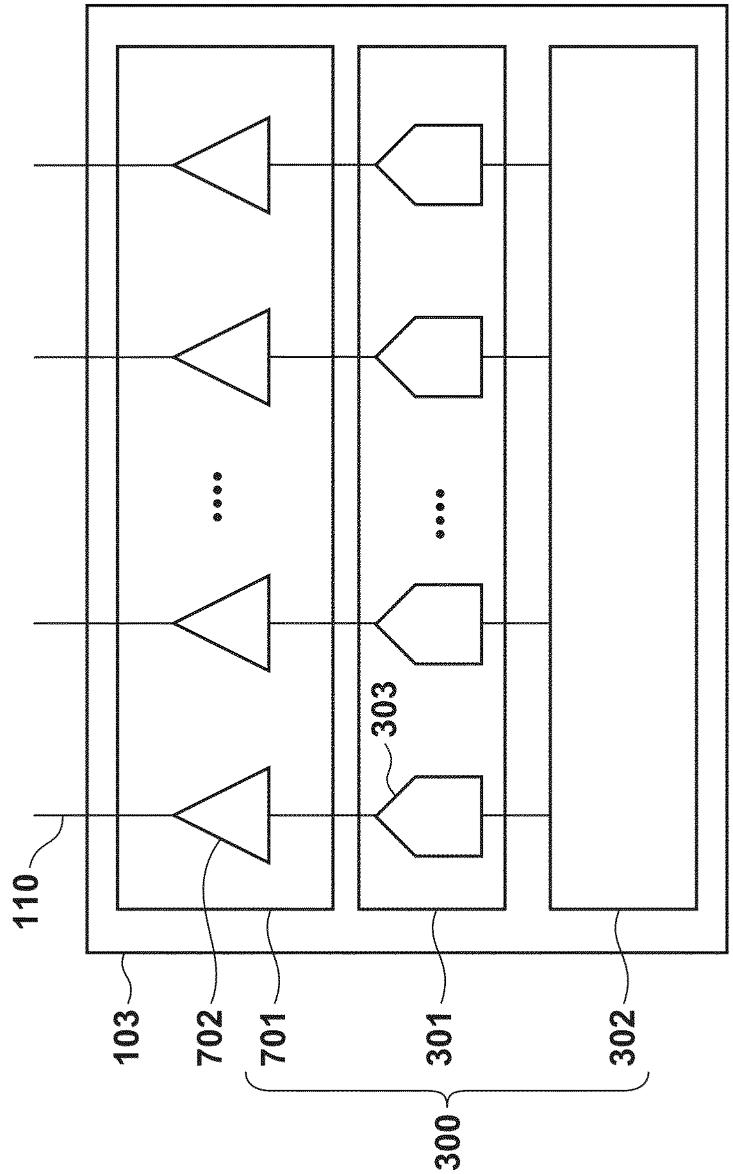
FIG. 7 is a circuit diagram showing an example of the arrangement of the signal processing circuit of the light emitting device shown in FIG. 1.

FIG. 7 is a circuit diagram showing an example of the arrangement of the signal processing circuit 300 arranged in the display data control board 103, which is different from the arrangement shown in FIG. 3. The signal processing circuit 300 shown in FIG. 7 includes a voltage buffer circuit 701 in addition to the DA conversion circuit 301 and the display data control circuit 302 arranged in the signal processing circuit 300 shown in FIG. 3. The voltage buffer circuit 701 can be formed from, for example, a plurality of voltage buffers 702. The voltage buffer circuit 701 outputs, as the data signal to the driving circuit 107, a signal generated corresponding to the output of the DA conversion circuit 301. More specifically, the voltage buffer 702 is configured to receive the output of the DAC 303 and output the buffered data signal to the signal line 110.

In the arrangement shown in FIG. 6, a case is conceivable in which, since the load capacitance caused by the wiring pattern 603 and the electrode 602 on the flexible board 601 is large, the driving capability of the DAC 303 becomes insufficient so that a predetermined light emission luminance cannot be obtained in the pixel array 105. Even in this case, by using the arrangement including the voltage buffer circuit 701 shown in FIG. 7, it is possible to avoid the insufficient driving capability of the DAC 303. Here, the example of arranging the display data control board 103 on the flexible board 601 and the voltage buffer circuit 701 is arranged in the signal processing circuit 300 in the display data control board 103 has been described. However, the present invention is not limited to this, and the voltage buffer circuit 701 may also be arranged in the signal processing circuit 300 in the display data control board 103 in the arrangement shown in FIG. 4 or 5. The voltage buffer circuit 701 may be arranged, as appropriate, in accordance with the driving capability required for the display data control board 103 (signal processing circuit 300).

Also in the case of mounting the display data control board 103 by chip-on-film mounting, like the light emitting device 101 shown in FIG. 6, the display board 102 can decide the driving capability of the driving circuit 107 in accordance with the load capacitance of the data signal line 109. As in the above-described arrangement, the load capacitance of the signal line 110 connected to the display data control board 103 does not largely change depending on the specifications such as the number and size of the pixels 104 arranged in the pixel array 105 included in the display board 102. Accordingly, for the display board 102 that can have various specifications, the general-purpose appropriate display data control board 103 can be used in accordance with the load capacitance caused by the electrode 602 and the wiring pattern 603 arranged in the flexible board 601. As a result, also in the arrangements shown in FIGS. 6 and 7, the design cost and manufacturing cost of the display data control board 103 can be kept low.

Here, application examples in which the light emitting device 101 according to this embodiment is applied to an image forming device, a display device, a photoelectric conversion device, an electronic apparatus, an illumination device, a moving body, and a wearable device will be described with reference to FIGS. 8A to 16B. The description will be given assuming that, for example, an organic light emitting element such as an organic EL element using an organic light emitting material is arranged in the pixel 104 of the light emitting device 101. Details of each component arranged in the pixel 104 of the light emitting device 101 described above will be described first, and the application examples will be described after that.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer may be provided between the protection layer and the color filter. The planarizing layer can be formed using acrylic resin or the like. The same applies to a case where a planarizing layer is provided between the color filter and the microlens.

Substrate

Quartz, glass, a silicon wafer, a resin, a metal, or the like may be used as a substrate. Furthermore, a switching element such as a transistor, a wiring pattern, and the like may be provided on the substrate, and an insulating layer may be provided thereon. The insulating layer may be made of any material as long as a contact hole can be formed so that the wiring pattern can be formed between the first electrode and the substrate and insulation from the unconnected wiring pattern can be ensured. For example, a resin such as polyimide, silicon oxide, silicon nitride, or the like may be used for the insulating layer.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a large work function may be selected. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used as the constituent material of the anode.

One of these electrode materials may be used singly, or two or more of them may be used in combination. The anode may be formed by a single layer or a plurality of layers.

If the electrode is used as a reflective electrode, for example, chromium, aluminum, silver, titanium, tungsten, molybdenum, an alloy thereof, a stacked layer thereof, or the like can be used. The above materials can function as a reflective film having no role as an electrode. If a transparent electrode is used as the electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be selected. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Silver may be used as the cathode. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good coverage is achieved for the film to be formed, and the resistance of the cathode can be lowered.

Pixel Isolation Layer

A pixel isolation layer may be formed by a so-called silicon oxide, such as silicon nitride (SiN), silicon oxynitride (SiON), or silicon oxide (SiO), formed using a Chemical Vapor Deposition (CVD) method. To increase the resistance in the in-plane direction of the organic compound layer, the organic compound layer, especially the hole transport layer may be thinly deposited on the side wall of the pixel isolation layer. More specifically, the organic compound layer can be deposited so as to have a thin film thickness on the side wall by increasing the taper angle of the side wall of the pixel isolation layer or the film thickness of the pixel isolation layer to increase vignetting during vapor deposition.

On the other hand, the taper angle of the side wall of the pixel isolation layer or the film thickness of the pixel isolation layer can be adjusted to the extent that no space is formed in the protection layer formed on the pixel isolation layer. Since no space is formed in the protection layer, it is possible to reduce generation of defects in the protection layer. Since generation of detects in the protection layer is reduced, a decrease in reliability caused by generation of a dark spot or occurrence of a conductive failure of the second electrode can be reduced.

According to this embodiment, even if the taper angle of the side wall of the pixel isolation layer is not acute, it is possible to effectively suppress leakage of charges to an adjacent pixel. As a result of this consideration, it has been found that the taper angle of 60° (inclusive) to 90° (inclusive) can sufficiently reduce the occurrence of defects. The film thickness of the pixel isolation layer may be 10 nm (inclusive) to 150 nm (inclusive). A similar effect can be obtained in an arrangement including only pixel electrodes without the pixel isolation layer. However, in this case, the film thickness of the pixel electrode is set to be equal to or smaller than half the film thickness of the organic layer or the end portion of the pixel electrode is formed to have a forward tapered shape of less than 60°. With this, short circuit of the organic light emitting element can be reduced.

Furthermore, in a case where the first electrode is the cathode and the second electrode is the anode, a high color gamut and low-voltage driving can be achieved by forming the electron transport material and charge transport layer and forming the light emitting layer on the charge transport layer.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer may be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation layer made of silicon nitride or the like may be provided on the cathode to suppress permeation of water or the like into the organic compound layer. For example, the protection layer can be formed by forming the cathode, transferring it to another chamber without breaking the vacuum, and forming silicon nitride having a thickness of 2 μm by the CVD method. The protection layer may be provided using an atomic layer deposition (ALD) method after deposition of the protection layer using the CVD method. The material of the protection layer by the ALD method is not limited but can be silicon nitride, silicon oxide, aluminum oxide, or the like. Silicon nitride may further be formed by the CVD method on the protection layer formed by the ALD method. The protection layer formed by the ALD method may have a film thickness smaller than that of the protection layer formed by the CVD method. More specifically, the film thickness of the protection layer formed by the ALD method may be 50% or less, or 10% or less of that of the protection layer formed by the CVD method.

Color Filter

A color filter may be provided on the protection layer. For example, a color filter considering the size of the organic light emitting element may be provided on another substrate, and the substrate with the color filter formed thereon may be bonded to the substrate with the organic light emitting element provided thereon. Alternatively, for example, a color filter may be patterned on the above-described protection layer using a photolithography technique. The color filter may be formed from a polymeric material.

Planarizing Layer

A planarizing layer may be arranged between the color filter and the protection layer. The planarizing layer is provided to reduce unevenness of the layer below the planarizing layer. The planarizing layer may be called a material resin layer without limiting the purpose of the layer. The planarizing layer may be formed from an organic compound, and may be made of a low-molecular material or a polymeric material. In consideration of reduction of unevenness, a polymeric organic compound may be used for the planarizing layer.

The planarizing layers may be provided above and below the color filter. In that case, the same or different constituent materials may be used for these planarizing layers. More specifically, examples of the material of the planarizing layer include polyvinyl carbazole resin, polycarbonate resin, polyester resin, ABS resin, acrylic resin, polyimide resin, phenol resin, epoxy resin, silicone resin, and urea resin.

Microlens

The organic light emitting device may include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

The microlens includes a first surface including a convex portion and a second surface opposite to the first surface. The second surface can be arranged on the functional layer (light emitting layer) side of the first surface. For this arrangement, the microlens needs to be formed on the light emitting device. If the functional layer is an organic layer, a process which produces high temperature in the manufacturing step of the microlens may be avoided. In addition, if it is configured to arrange the second surface on the functional layer side of the first surface, all the glass transition temperatures of an organic compound forming the organic layer may be 100° C. or more. For example, 130° C. or more is suitable.

Counter Substrate

A counter substrate may be arranged on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present disclosure may be formed by the method to be described below.

The organic compound layer forming the organic light emitting element according to the embodiment of the present disclosure can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels may include, for example, R, G, and B emission colors, respectively.

In each pixel, a region also called a pixel opening emits light. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Disclosure The organic light emitting element according to an embodiment of the present disclosure can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Figure 8A:
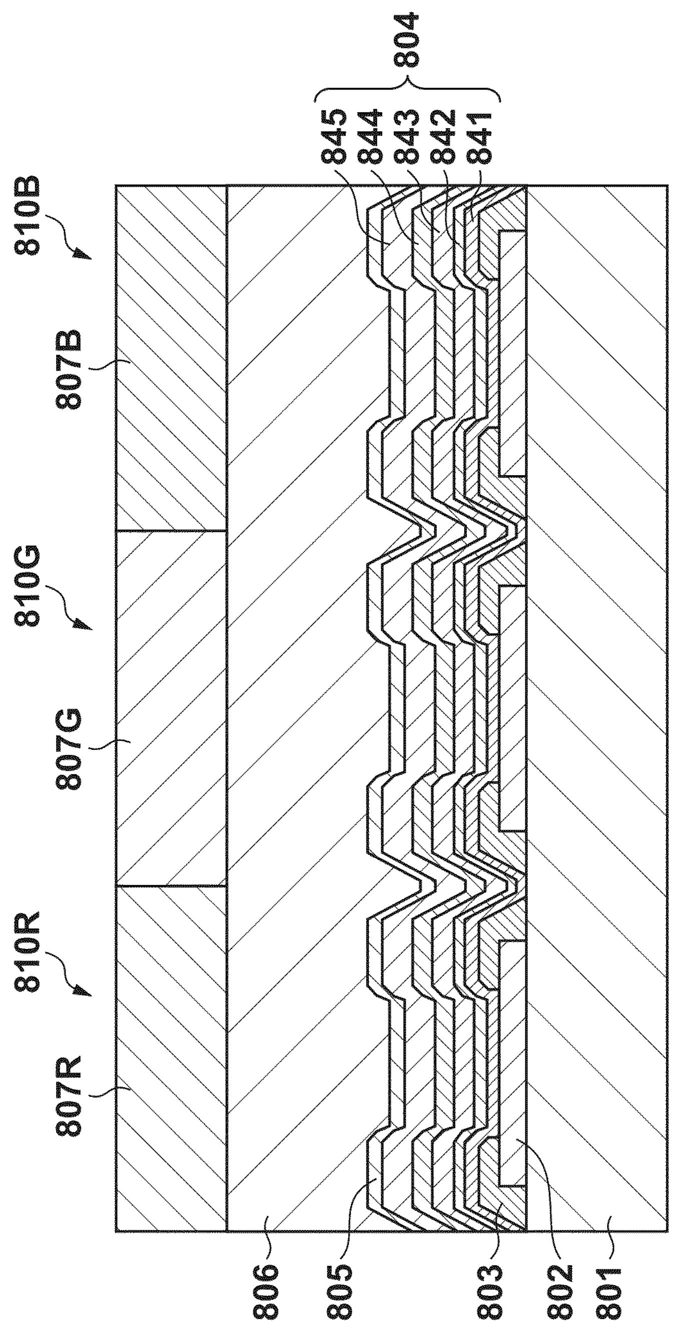
FIGS. 8A and 8B are sectional views showing an example of the arrangement of the pixel of the light emitting device shown in FIG. 1.

More details will be described next with reference to the accompanying drawings. FIG. 8A shows an example of the pixel 104 arranged in the light emitting device 101. The pixel includes sub-pixels 810 (pixels 104). The sub-pixels are divided into sub-pixels 810R, 810G, and 810B by emitted light components. The light emission colors may be discriminated by the wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 can also be called a bank or a pixel isolation film. The insulating layer 803 covers the end of the first electrode, and is arranged to surround the first electrode. A portion of the first electrode where no insulating layer 803 is arranged is in contact with the organic compound layer 804 to form a light emitting region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a semi-transmissive electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on a planarizing film (not shown). A resin protection layer (not shown) may be arranged on the color filters. The color filters can be formed on the protection layer 806. Alternatively, the color filters can be provided on the counter substrate such as a glass substrate, and then the substrate may be bonded.

Figure 8B:
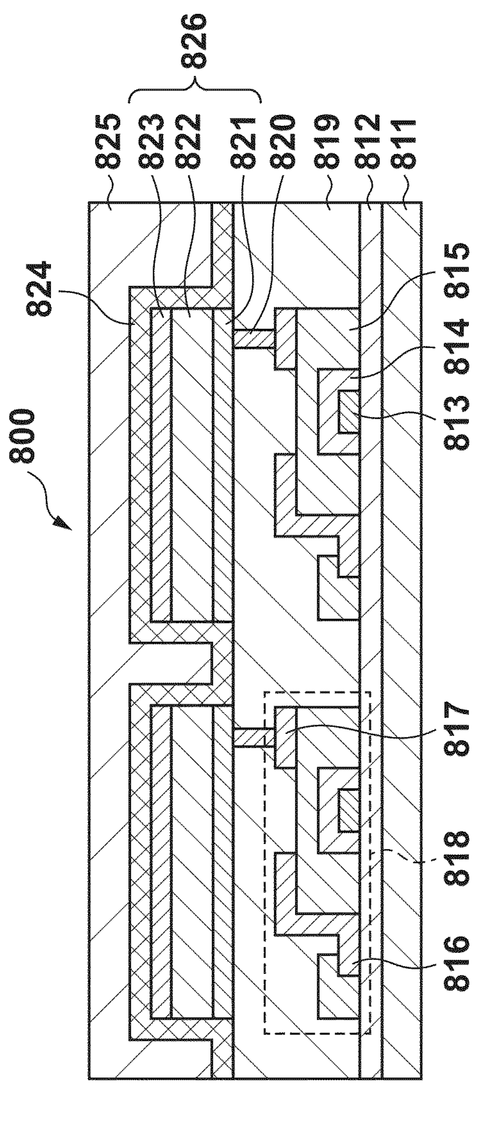

A display device 800 (corresponding to the above-described light emitting device 101) shown in FIG. 8B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

A method of electrically connecting the electrodes (anode and cathode) included in the organic light emitting element 826 and the electrodes (source electrode and drain electrode) included in the TFT is not limited to that shown in FIG. 8B. That is, one of the anode and cathode and one of the source electrode and drain electrode of the TFT are electrically connected. The TFT indicates a thin-film transistor.

In the display device 800 shown in FIG. 8B, an organic compound layer is illustrated as one layer. However, an organic compound layer 822 may include a plurality of layers. A first protection layer 824 and a second protection layer 825 are provided on a cathode 823 to suppress deterioration of the organic light emitting element.

A transistor is used as a switching element in the display device 800 shown in FIG. 8B but may be used as another switching element.

The transistor used in the display device 800 shown in FIG. 8B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 800 shown in FIG. 8B may be formed in the substrate such as a silicon substrate. Forming the transistor in the substrate means forming the transistor by processing the substrate such as a silicon substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in a plane to display an image with the light emission luminances of the respective elements. Here, the switching element according to this embodiment is not limited to the TFT, and may be a transistor formed from low-temperature polysilicon or an active matrix driver formed on the substrate such as a silicon substrate. The term "on the substrate" may mean "in the substrate". Whether to provide a transistor in the substrate or use a TFT is selected based on the size of the display unit. For example, if the size is about 0.5 inch, the organic light emitting element may be provided on the silicon substrate.

Figure 9A:
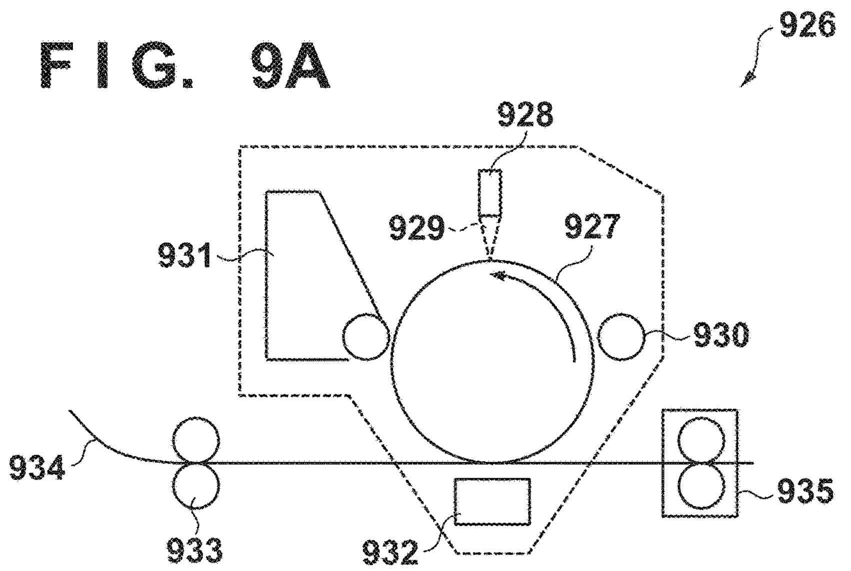
FIGS. 9A to 9C are views showing an example of an image forming device using the light emitting device according to the embodiment.
Figure 9B:
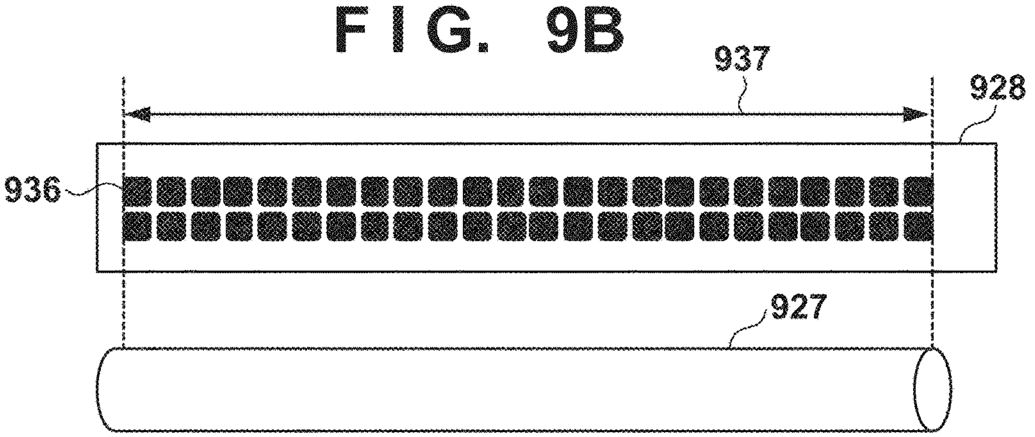
Figure 9C:
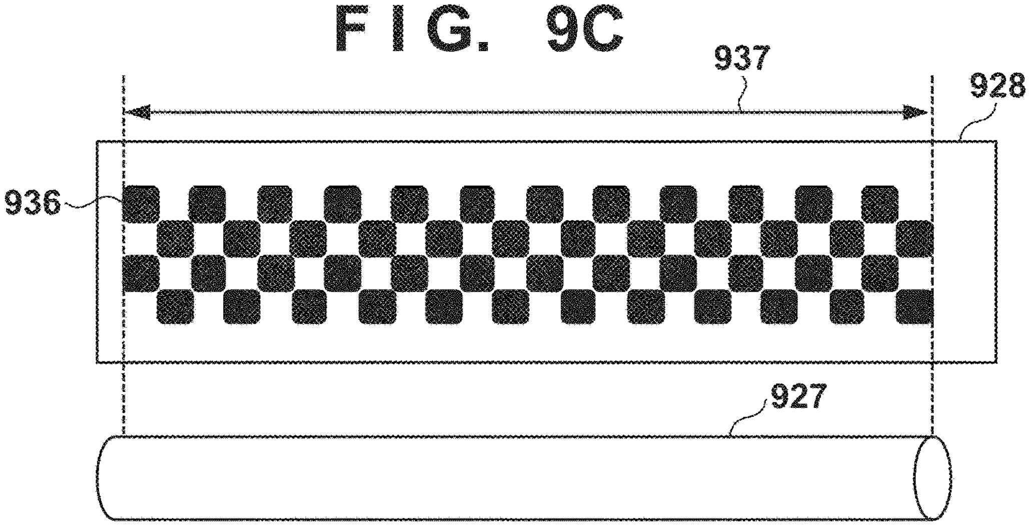

FIGS. 9A to 9C are schematic views showing an example of an image forming device using the light emitting device 101 according to this embodiment. An image forming device 926 shown in FIG. 9A includes a photosensitive member 927, an exposure light source 928, a developing unit 931, a charging unit 930, a transfer device 932, a conveyance unit 933 (a conveyance roller in the arrangement shown in FIG. 9A), and a fixing device 935.

Light 929 is emitted from the exposure light source 928, and an electrostatic latent image is formed on the surface of the photosensitive member 927. The light emitting device 101 can be applied to the exposure light source 928. The developing unit 931 can function as a developing device that includes a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper, a film, or the like. The fixing device 935 fixes the image formed on the print medium.

Each of FIGS. 9B and 9C is a schematic view showing a form in which a plurality of light emitting units 936 are arranged in the exposure light source 928 along the longitudinal direction of a long substrate. The light emitting device 101 can be applied to each of the light emitting units 936. That is, a plurality of the pixels 104 are arranged along the longitudinal direction of the substrate. A direction 937 is a direction parallel to the axis of the photosensitive member 927. This column direction matches the direction of the axis upon rotating the photosensitive member 927. This direction 937 can also be referred to as the long-axis direction of the photosensitive member 927.

FIG. 9B shows a form in which the light emitting units 936 are arranged along the long-axis direction of the photosensitive member 927. FIG. 9C shows a form, which is a modification of the arrangement of the light emitting units 936 shown in FIG. 9B, in which the light emitting units 936 are arranged in the column direction alternately between the first column and the second column. The light emitting units 936 are arranged at different positions in the row direction between the first column and the second column. In the first column, the plurality of light emitting units 936 are arranged apart from each other. In the second column, the light emitting unit 936 is arranged at the position corresponding to the space between the light emitting units 936 in the first column. Furthermore, in the row direction, the plurality of light emitting units 936 are arranged apart from each other. The arrangement of the light emitting units 936 shown in FIG. 9C can be referred to as, for example, an arrangement in a grid pattern, an arrangement in a staggered pattern, or an arrangement in a checkered pattern.

Figure 10:
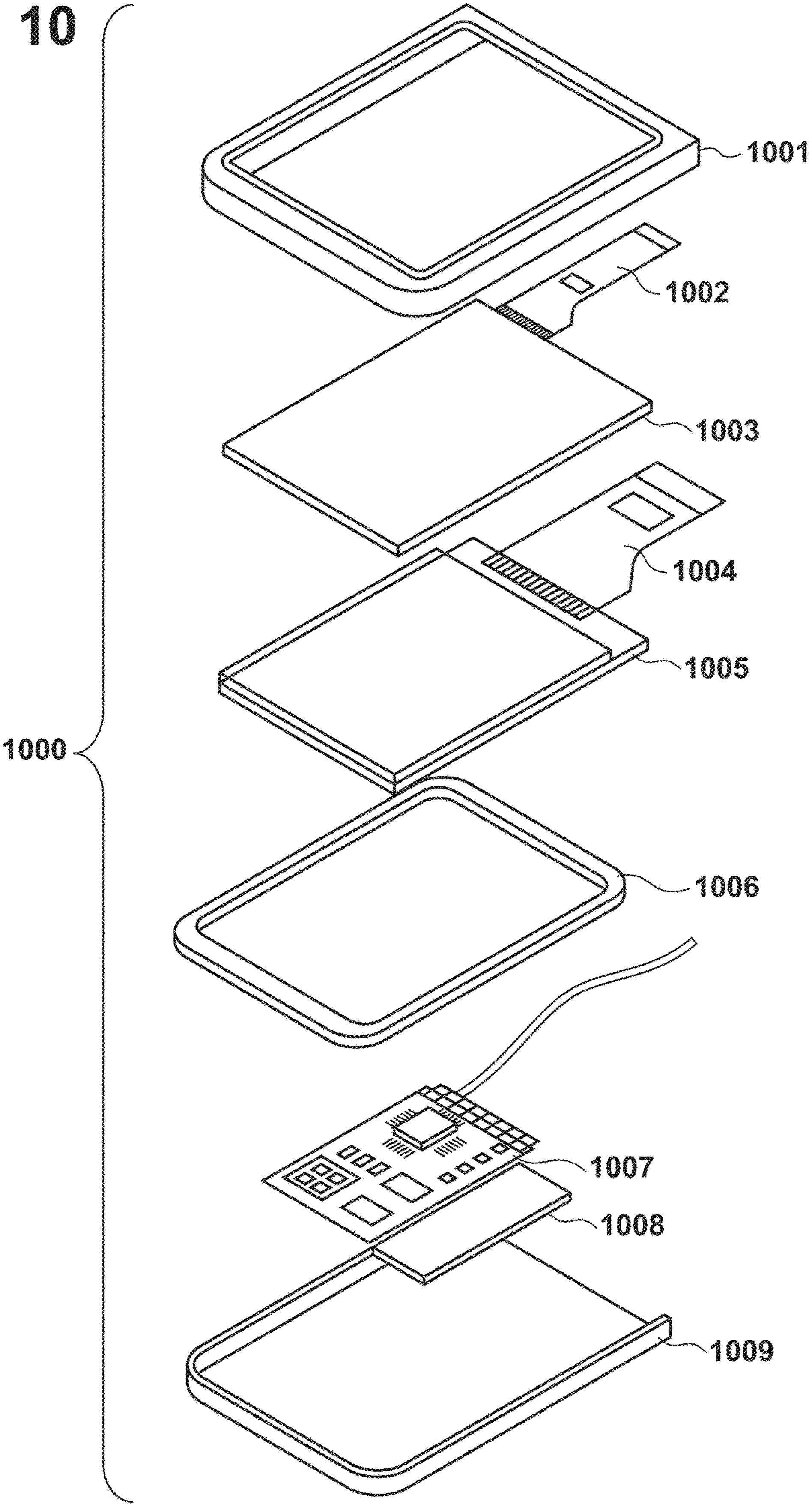
FIG. 10 is a view showing an example of a display device using the light emitting device according to the embodiment.

FIG. 10 is a schematic view showing an example of the display device using the light emitting device 101 according to this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 101 can be applied to the display panel 1005. The pixels 104 arranged in the light emitting device 101 functioning as the display panel 1005 operate in a state in which they are connected to the active elements such as transistors arranged on the circuit board 1007.

The display device 1000 shown in FIG. 10 can be used for a display unit of a photoelectric conversion device (also referred to as an image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 11:
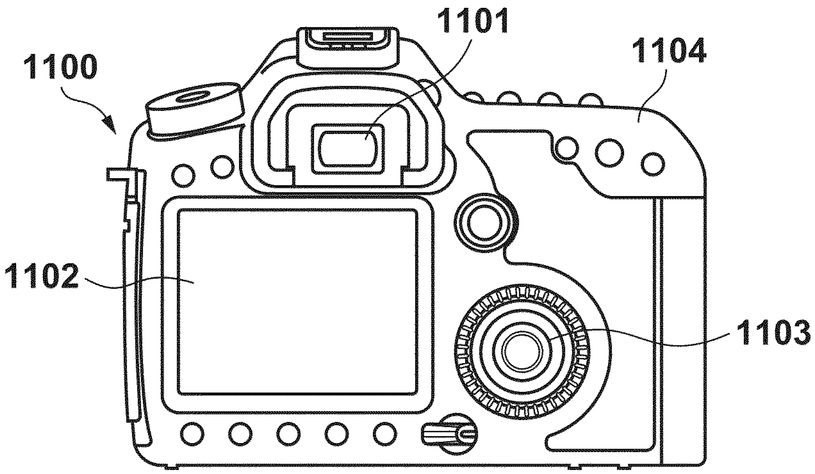
FIG. 11 is a view showing an example of a photoelectric conversion device using the light emitting device according to the embodiment.

FIG. 11 is a schematic view showing an example of the photoelectric conversion device using the light emitting device 101 according to this embodiment. A photoelectric conversion device 1100 can include a viewfinder 1101, a rear display 1102, an operation unit 1103, and a housing 1104. The photoelectric conversion device 1100 can also be called an image capturing device. The light emitting device 101 according to this embodiment can be applied to the viewfinder 1101 or the rear display 1102 as a display unit. In this case, the light emitting device 101 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the light emitting device 101 in which the pixel 104 including the light emitting element using the organic light emitting material such as an organic EL element is arranged may be used for the viewfinder 1101 or the rear display 1102. This is so because the organic light emitting material has a high response speed. The light emitting device 101 using the organic light emitting material can be used for the devices that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 101 may be applied to a display unit of an electronic apparatus. At this time, the display unit can have both a display function and an operation function. Examples of the portable terminal are a portable phone such as a smartphone, a tablet, and a head mounted display.

Figure 12:
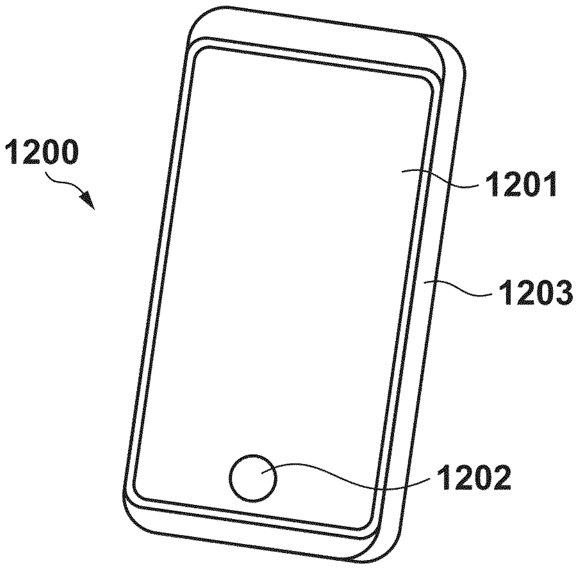
FIG. 12 is a view showing an example of an electronic apparatus using the light emitting device according to the embodiment.

FIG. 12 is a schematic view showing an example of an electronic apparatus using the light emitting device 101 according to this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 101 according to this embodiment can be applied to the display unit 1201.

Figure 13A:
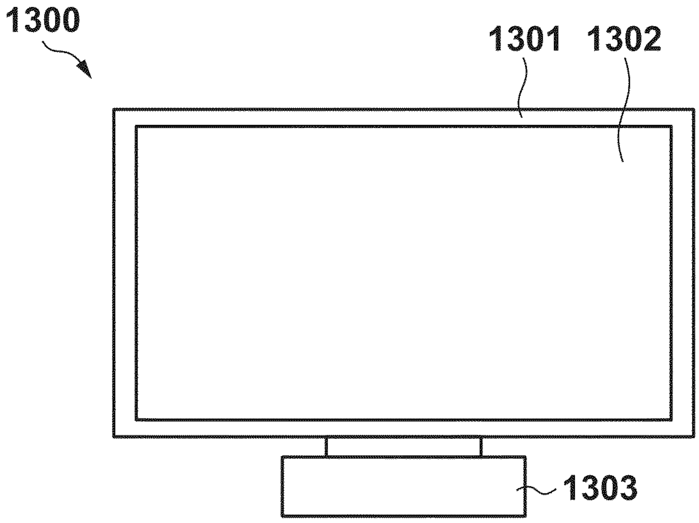
FIGS. 13A and 13B are views each showing an example of a display device using the light emitting device according to the embodiment.
Figure 13B:
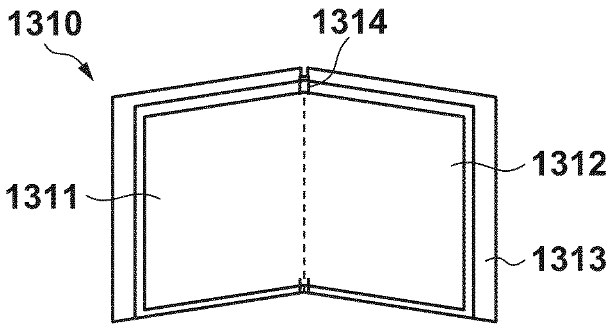

FIGS. 13A and 13B are schematic views showing examples of the display device using the light emitting device 101 according to this embodiment. FIG. 13A shows a display device such as a television monitor or a PC monitor. A display device 1300 includes a frame 1301 and a display unit 1302. The light emitting device 101 according to this embodiment can be applied to the display unit 1302. The display device 1300 can include a base 1303 that supports the frame 1301 and the display unit 1302. The base 1303 is not limited to the form shown in FIG. 13A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 13B is a schematic view showing another example of the display device using the light emitting device 101 according to this embodiment. A display device 1310 shown in FIG. 13B can be folded, and is a so-called foldable display device. The display device 1310 includes a first display unit 1311, a second display unit 1312, a housing 1313, and a bending point 1314. The light emitting device 101 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 14:
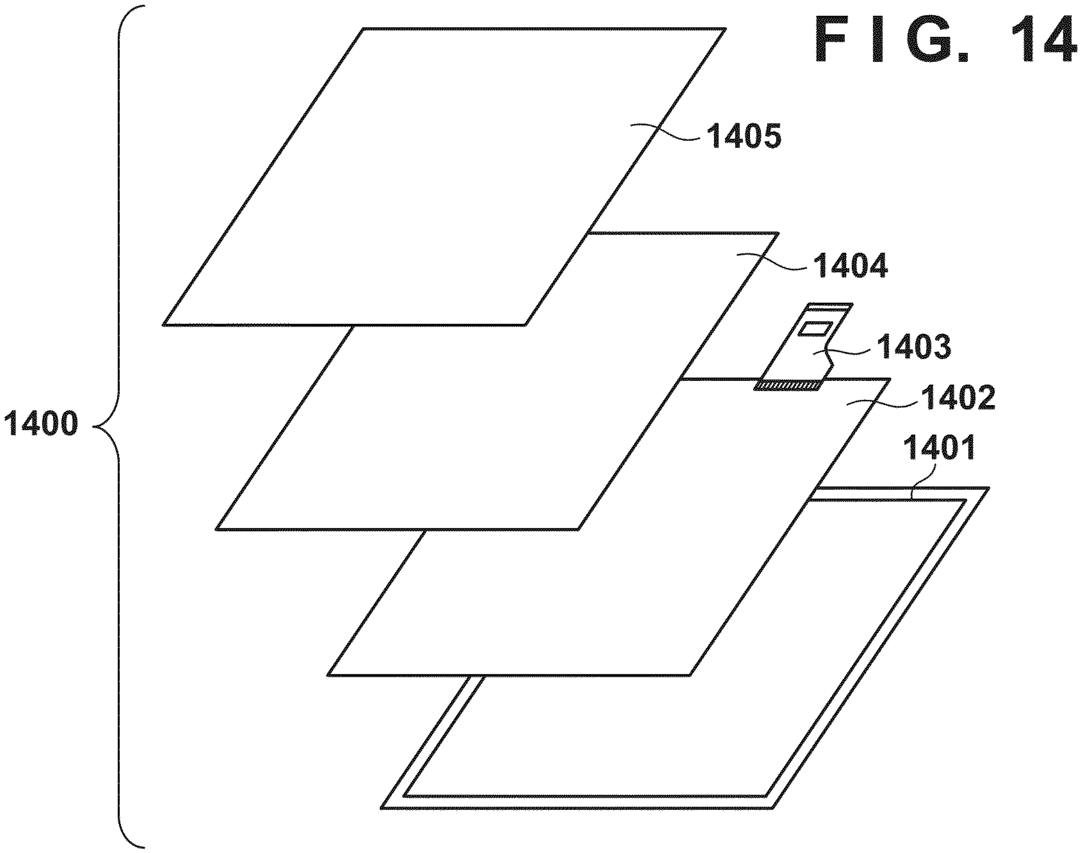
FIG. 14 is a view showing an example of an illumination device using the light emitting device according to the embodiment.

FIG. 14 is a schematic view showing an example of the illumination device using the light emitting device 101 according to this embodiment. An illumination device 1400 can include a housing 1401, a light source 1402, a circuit board 1403, an optical film 1404, and a light diffusing unit 1405. The light emitting device 101 according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the light emitting device 101 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 15:
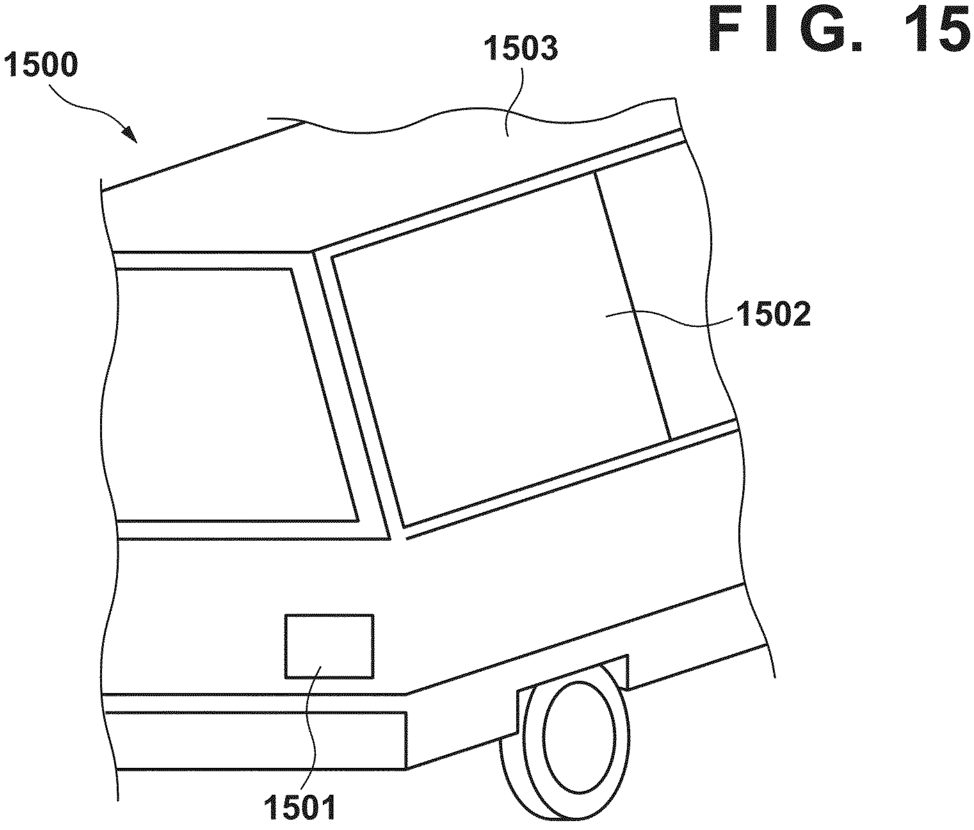
FIG. 15 is a view showing an example of a moving body using the light emitting device according to the embodiment.

FIG. 15 is a schematic view of an automobile having a taillight as an example of a vehicle lighting appliance using the light emitting device 101 according to this embodiment. An automobile 1500 has a taillight 1501, and can have a form in which the taillight 1501 is turned on when performing a braking operation or the like. The light emitting device 101 according to this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The light emitting device 101 according to this embodiment can be applied to the taillight 1501. The taillight 1501 can include a protection member for protecting the light emitting device 101 functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display such as a head-up display. For this transparent display, the light emitting device 101 according to this embodiment may be used. In this case, the constituent materials of the electrodes and the like of the light emitting device 101 are formed by transparent members.

Figure 16A:
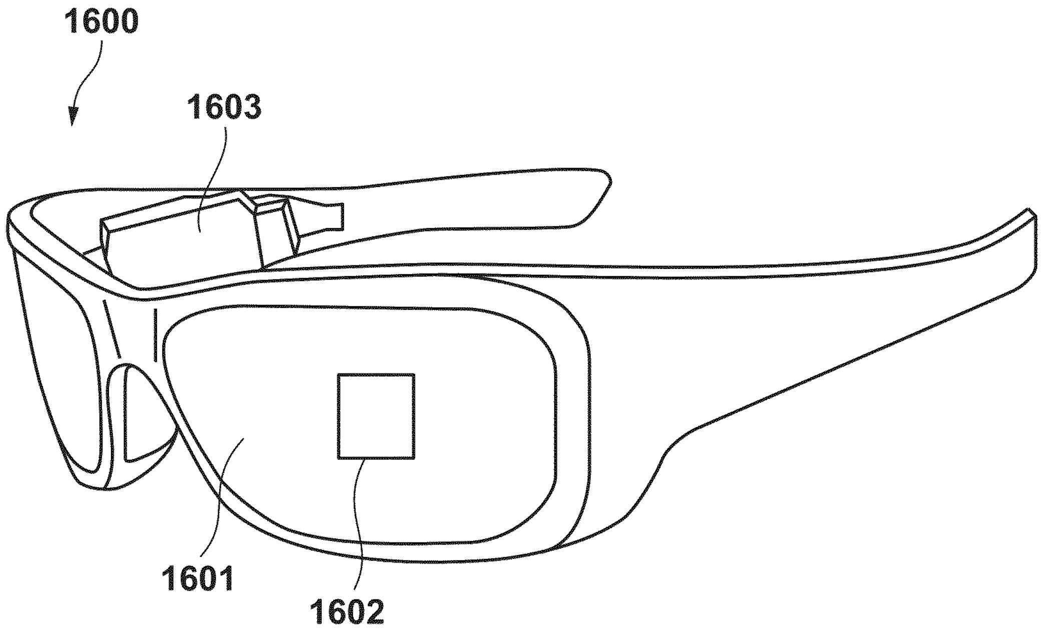
FIGS. 16A and 16B are views each showing an example of a wearable device using the light emitting device according to the embodiment.
Figure 16B:
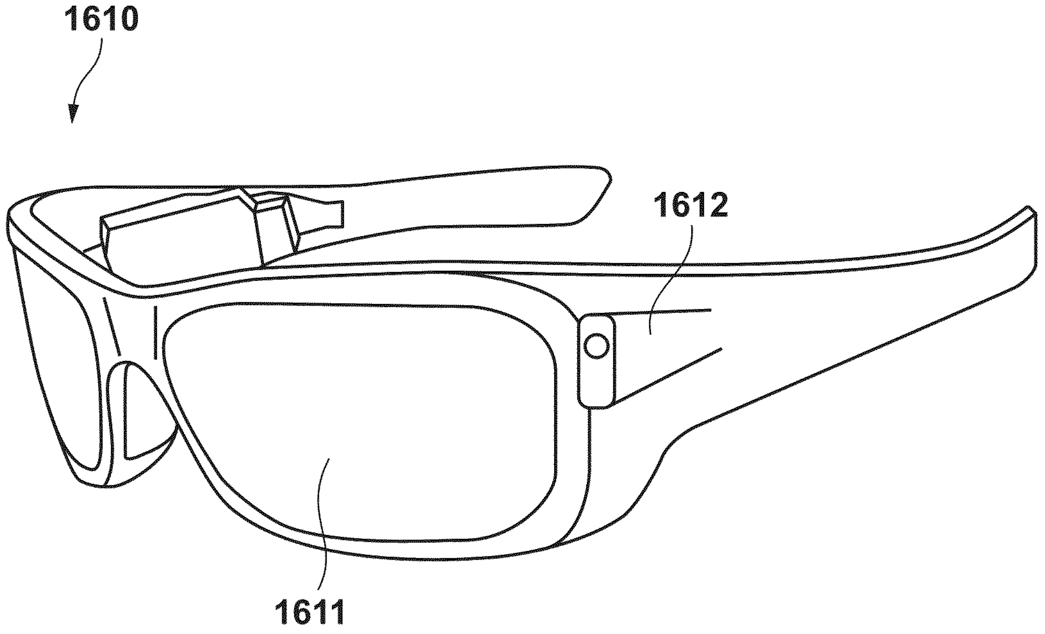

Further application examples of the light emitting device 101 according to this embodiment will be described with reference to FIGS. 16A and 16B. The light emitting device 101 can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 16A. An image capturing device 1602 such as a CMOS sensor or an SPAD is provided on the surface side of a lens 1601 of the glasses 1600. In addition, the light emitting device 101 according to this embodiment is provided on the back surface side of the lens 1601.

The glasses 1600 further include a control device 1603. The control device 1603 functions as a power supply that supplies electric power to the image capturing device 1602 and the light emitting device 101 according to each embodiment. In addition, the control device 1603 controls the operations of the image capturing device 1602 and the light emitting device 101. An optical system configured to condense light to the image capturing device 1602 is formed on the lens 1601.

Glasses 1610 (smartglasses) according to one application example will be described with reference to FIG. 16B. The glasses 1610 include a control device 1612, and an image capturing device corresponding to the image capturing device 1602 and the light emitting device 101 are mounted on the control device 1612. The image capturing device in the control device 1612 and an optical system configured to project light emitted from the light emitting device 101 are formed in a lens 1611, and an image is projected to the lens 1611. The control device 1612 functions as a power supply that supplies electric power to the image capturing device and the light emitting device 101, and controls the operations of the image capturing device and the light emitting device 101. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 101 according to the embodiment of the present disclosure can include an image capturing device including a light receiving element, and control a displayed image based on the line-of-sight information of the user from the image capturing device.

More specifically, the light emitting device 101 decides a first visual field region at which the user is gazing and a second visual field region other than the first visual field region based on the line-of-sight information. The first visual field region and the second visual field region may be decided by the control device of the light emitting device 101, or those decided by an external control device may be received. In the display region of the light emitting device 101, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 101, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 101, the image capturing device, or an external device. If the external device holds the AI program, it is transmitted to the light emitting device 101 via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-207170, filed Dec. 7, 2023, which is hereby incorporated by reference herein in its entirety.

What is claimed is:

1. A light emitting device comprising:

a first board in which a data signal line and a plurality of pixels connected to the data signal line are arranged; and a second board in which a signal processing circuit including a digital-analog conversion circuit is arranged to supply a data signal based on input image data to the plurality of pixels, wherein the first board further includes a driving circuit configured to supply, to the data signal line, a signal voltage based on the data signal input from the signal processing circuit, wherein in a planar view, the driving circuit in the first board and the signal processing circuit in the second board are arranged to at least partially overlap each other, and wherein the second board is arranged to at least partially cover the driving circuit.

2. The device according to claim 1, wherein the second board includes an output terminal used to output the data signal, and wherein in a planar view, the output terminal is arranged to overlap the driving circuit.

3. The device according to claim 2, wherein the first board includes an input terminal used to receive the data signal, and wherein in a planar view, the input terminal is arranged to overlap the driving circuit.

4. The device according to claim 1, wherein the signal processing circuit further includes a voltage buffer circuit, and wherein the voltage buffer circuit outputs, as the data signal to the driving circuit, a signal generated corresponding to an output of the digital-analog conversion circuit.

5. The device according to claim 1, wherein the first board and the second board are mounted on a chip-on-chip.

6. The device according to claim 1, wherein the second board is arranged on a flexible board by chip-on-film mounting.

7. The device according to claim 1, wherein the plurality of pixels include a pixel comprising a first transistor, wherein the driving circuit comprises a second transistor, and wherein a film thickness of a gate insulating film of the first transistor and a film thickness of a gate insulating film of the second transistor are equal to each other.

8. The device according to claim 1, wherein a film thickness of a gate insulating film of a transistor arranged in each of the plurality of pixels and a film thickness of a gate insulating film of a transistor arranged in the driving circuit are equal to each other.

9. The device according to claim 1, wherein the signal processing circuit comprises a transistor that is more miniaturized than transistors arranged in the plurality of pixels and the driving circuit.

10. A photoelectric conversion device comprising:

an optical unit including a plurality of lenses;

an image sensor configured to receive light having passed through the optical unit; and a display unit configured to display an image, wherein the display unit displays an image captured by the image sensor, and includes the light emitting device according to claim 1.

11. An electronic apparatus comprising:

a housing provided with a display unit; and a communication unit provided in the housing and configured to perform external communication, wherein the display unit includes the light emitting device according to claim 1.

12. A light emitting device comprising:

a first board in which a data signal line and a plurality of pixels connected to the data signal line are arranged; and a second board in which a signal processing circuit including a digital-analog conversion circuit is arranged to supply a data signal based on input image data to the plurality of pixels, wherein the first board further includes a driving circuit configured to supply, to the data signal line, a signal voltage based on the data signal input from the signal processing circuit, wherein in a planar view, the driving circuit in the first board and the signal processing circuit in the second board are arranged to at least partially overlap each other, wherein the signal processing circuit further includes a voltage buffer circuit, and wherein the voltage buffer circuit outputs, as the data signal to the driving circuit, a signal generated corresponding to an output of the digital-analog conversion circuit.

13. A light emitting device comprising:

a first board in which a data signal line and a plurality of pixels connected to the data signal line are arranged; and a second board in which a signal processing circuit including a digital-analog conversion circuit is arranged to supply a data signal based on input image data to the plurality of pixels, wherein the first board further includes a driving circuit configured to supply, to the data signal line, a signal voltage based on the data signal input from the signal processing circuit, wherein in a planar view, the driving circuit in the first board and the signal processing circuit in the second board are arranged to at least partially overlap each other, wherein the plurality of pixels include a pixel comprising a first transistor, wherein the driving circuit comprises a second transistor, and wherein a film thickness of a gate insulating film of the first transistor and a film thickness of a gate insulating film of the second transistor are equal to each other.

* * * * *